(12) United States Patent
Wiese et al.

(10) Patent No.: US 7,555,948 B2
(45) Date of Patent: *Jul. 7, 2009

(54) PROCESS CONDITION MEASURING DEVICE WITH SHIELDING

(76) Inventors: Lynn Karl Wiese, 3534 Butcher Dr., Santa Clara, CA (US) 95051; Earl M. Jensen, 398 Peachtree La., San Jose, CA (US) 95128

( * ) Notice: Subject to any disclaimer, the term of this patent is extended or adjusted under 35 U.S.C. 154(b) by 0 days.

This patent is subject to a terminal disclaimer.

(21) Appl. No.: 11/381,992

(22) Filed: May 5, 2006

(65) Prior Publication Data

US 2007/0251339 A1 Nov. 1, 2007

Related U.S. Application Data

(63) Continuation-in-part of application No. 11/380,985, filed on May 1, 2006.

(51) Int. Cl.
*G01D 11/24* (2006.01)

(52) U.S. Cl. ........................................ 73/431

(58) Field of Classification Search ........................ None
See application file for complete search history.

(56) References Cited

U.S. PATENT DOCUMENTS

| | | | |
|---|---|---|---|
| RE32,369 E | | 3/1987 | Stockton et al. |
| 5,262,944 A | | 11/1993 | Weisner et al. |
| 5,426,412 A | * | 6/1995 | Tomonari et al. ............. 338/18 |
| 5,435,646 A | | 7/1995 | McArthur |
| 5,444,637 A | | 8/1995 | Smesny et al. |
| 5,564,889 A | | 10/1996 | Araki |
| 5,920,984 A | * | 7/1999 | Persson et al. ................. 29/836 |
| 5,969,639 A | | 10/1999 | Lauf et al. |
| 5,970,313 A | | 10/1999 | Rowland et al. |
| 6,010,538 A | | 1/2000 | Sun et al. |
| 6,033,922 A | | 3/2000 | Rowland et al. |
| 6,075,909 A | | 6/2000 | Ressl |
| 6,100,506 A | | 8/2000 | Colelli, Jr. et al. |
| 6,190,040 B1 | | 2/2001 | Renken et al. |
| 6,244,121 B1 | | 6/2001 | Hunter |

(Continued)

FOREIGN PATENT DOCUMENTS

EP 1014437 A2 6/2000

(Continued)

OTHER PUBLICATIONS

U.S. Appl. No. 60/285,613, filed Apr. 19, 2001; Freed et al.; "Firmware, Methods, Apparatus, and Computer Program Products for Wafer Sensors."

(Continued)

*Primary Examiner*—Robert R Raevis
(74) *Attorney, Agent, or Firm*—Joshua D. Isenberg; JDI Patent

(57) ABSTRACT

A process condition measuring device has electronic components sandwiched between two conductive substrate portions. The conductive substrate portions are joined by an electrically conductive pathway. Native oxide is removed from substrate portions and electrically conductive contact pads are formed that are then joined together with electrically conductive adhesive to form the electrically conductive pathway. Sensors may be located on the exterior of the process condition measuring device with conductive leads extending to shielded electronic components.

9 Claims, 7 Drawing Sheets

U.S. PATENT DOCUMENTS

| | | |
|---|---|---|
| 6,313,903 B1 | 11/2001 | Ogata |
| 6,325,536 B1 | 12/2001 | Renken et al. |
| 6,377,130 B1 | 4/2002 | Haman |
| 6,377,870 B1 | 4/2002 | Blaesing-Bangert et al. |
| 6,378,378 B1 | 4/2002 | Fisher |
| 6,424,141 B1 | 7/2002 | Hollman et al. |
| 6,472,240 B2 | 10/2002 | Akram et al. |
| 6,542,835 B2 | 4/2003 | Mundt |
| 6,553,277 B1 | 4/2003 | Yagisawa et al. |
| 6,671,166 B1 | 12/2003 | Penneau et al. |
| 6,671,660 B2 | 12/2003 | Freed |
| 6,691,068 B1 | 2/2004 | Freed et al. |
| 6,734,027 B2 | 5/2004 | Jonkers |
| 6,738,722 B2 | 5/2004 | Polla et al. |
| 6,741,945 B2 | 5/2004 | Polla et al. |
| 6,759,253 B2 | 7/2004 | Usui et al. |
| 6,789,034 B2 | 9/2004 | Freed |
| 6,790,763 B2 | 9/2004 | Kondo et al. |
| 6,803,756 B2 | 10/2004 | Hollman et al. |
| 6,807,503 B2 | 10/2004 | Ye et al. |
| 6,828,225 B2 | 12/2004 | Kondo et al. |
| 6,830,650 B2 | 12/2004 | Roche et al. |
| 6,842,025 B2 | 1/2005 | Gershenzon et al. |
| 6,889,568 B2 | 5/2005 | Renken |
| 6,895,831 B2 | 5/2005 | Hunter |
| 6,907,364 B2 | 6/2005 | Poolla et al. |
| 6,916,147 B2 | 7/2005 | Suh et al. |
| 6,959,255 B2 | 10/2005 | Ye et al. |
| 6,966,235 B1 | 11/2005 | Paton |
| 6,971,036 B2 | 11/2005 | Freed |
| 6,995,691 B2 | 2/2006 | Parsons |
| 7,016,754 B2 | 3/2006 | Poolla et al. |
| 7,053,355 B2 | 5/2006 | Ye et al. |
| 7,091,503 B2 | 8/2006 | Johnson et al. |
| 7,127,362 B2 | 10/2006 | Mundt |
| 7,135,852 B2 | 11/2006 | Renken et al. |
| 2002/0045293 A1 | 4/2002 | Tsunoi ...................... 438/108 |
| 2003/0077153 A1 | 4/2003 | Elliott et al. |
| 2003/0223057 A1 | 12/2003 | Ramsey et al. |
| 2003/0226688 A1 * | 12/2003 | Jairazbhoy et al. .......... 174/252 |
| 2004/0074323 A1 | 4/2004 | Renken |
| 2004/0131226 A1 | 7/2004 | Poolla |
| 2004/0154417 A1 | 8/2004 | Renken et al. |
| 2004/0236524 A1 | 11/2004 | Mundt ........................ 702/56 |
| 2004/0267501 A1 | 12/2004 | Freed et al. |
| 2005/0126315 A1 | 6/2005 | Hunter |
| 2005/0136850 A1 * | 6/2005 | Arai ........................... 455/88 |
| 2005/0156165 A1 | 7/2005 | Eldridge et al. ............... 257/48 |

FOREIGN PATENT DOCUMENTS

| | | |
|---|---|---|
| WO | WO 00/68986 | 11/2000 |
| WO | WO 02/17030 A3 | 2/2002 |
| WO | WO 03/067183 | 8/2003 |
| WO | WO 2004/051713 | 6/2004 |
| WO | WO 2006022520 | 3/2006 |

OTHER PUBLICATIONS

U.S. Appl. No. 60/285,439, filed Apr. 19, 2001; Freed et al.; "Methods Apparatus, and Computer Program Products for Obtaining Data for Process Operation, Optimization, Monitoring, and Control."

U.S. Appl. No. 60/354,551, filed Feb. 6, 2002, to Ramsey et al., entitled "Wafer-Like Sensor."

U.S. Appl. No. 60/525,710, filed Nov. 29, 2003, to Mundt et al., entitled "Sensor Apparatus Automated Management Methods and Apparatus."

Baker et al.; "A Novel In Situ Monitoring Technique for Reactive Ion Etching Using a Surface Micromachined Sensor," IEEE Transactions on Semiconductor Manufacturing, vol. 11, No. 2, May 1998, pp. 254-264.

Freed; "Wafer-Mounted Sensor Arrays for Plasma Etch Processes", Dissertation, Univ. of CA. Berkeley, Fall 2001, 89 pages.

Freed et al.; "Autonomous On-Wafer Sensors for Process Modeling, Diagnosis, and Control," IEEE Transactions on Semiconductor Manufacturing, vol. 14, No. 3, Aug. 2001, pp. 255-264.

International Search Report and Written Opinion of the International Searching Authority International Patent Application No. PCT/US2007/066997 mailed Feb. 29, 2008.

* cited by examiner

PROCESS CONDITION MEASURING DEVICE WITH SHIELDING

CROSS-REFERENCE TO RELATED APPLICATIONS

This application is a continuation-in-part of U.S. application Ser. No. 11/380,985, filed May 1, 2006; which application is hereby incorporated by reference in its entirety.

BACKGROUND OF THE INVENTION

This application relates to measurement of processing conditions in target environments, particularly target environments within processing systems used in automated processing of workpieces. Such workpieces may include semiconductor wafers, glass substrates for flat-panel displays and disks for magnetic memories. All patents, patent applications and other documents referred to in this application are hereby incorporated by reference in their entirety for all purposes.

The fabrication of an integrated circuit, display or disc memory generally employs numerous processing steps carried out on a workpiece (production substrate). Each process step may be carefully monitored in order to provide an operational device. Throughout the imaging process, deposition and growth process, etching and masking process, etc., it may be critical, for example, that temperature, gas flow, vacuum, pressure, chemical, gas or plasma composition and exposure distance be carefully controlled during a particular step. Careful attention to the various processing conditions involved in a step may be a requirement of good semiconductor or thin film processes. Any deviation from desired processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and, thus, the performance of the integrated circuit. Sensors may be placed at various points in and about a processing chamber in order to attempt to measure processing conditions experienced by a workpiece. However, even where sensors are placed close to a workpiece, conditions experienced by a sensor may be different from conditions experienced by a workpiece, especially in a rapidly changing environment such as during a rapid temperature change.

Using sensors attached to a sensor substrate of the same or similar material and dimensions to those of a production substrate provides an accurate measure of process conditions because measurements are made at locations within, or on a surface of, a sensor substrate. The material properties of the sensor substrate are close to the material properties of production substrates. A sensor substrate with sensors and related electronic circuits may be considered a Process Condition Measuring Device (PCMD). PCMDs may be subject to the same processing as production substrates so that the processing conditions experienced by production substrates may be accurately estimated. In some examples, data are relayed to a unit outside a processing system in real time, either by a wired connection or wirelessly. Alternatively, process condition data may be stored in a memory in the PCMD and later recovered for analysis.

Gradients and variations exist throughout the chamber for virtually all process conditions. These gradients, therefore, also exist across the surface of a substrate. It is generally desirable to obtain more than one measurement for a particular processing condition. By gathering measurements of a processing condition at various points across a substrate, the gradient of that processing condition across a production substrate may be estimated. However, such measurements may be affected by differences between production substrates and PCMDs. Several designs have been described for process condition measuring devices that resemble production substrates in their physical properties or dimensions.

In some applications, PCMDs may be exposed to harsh conditions that may damage certain components, or cause disturbance in measurements. Radio Frequency (RF) or other electromagnetic radiation in some environments may affect electronic components in a PCMD, for example, by causing noise that disturbs readings. RF radiation is used in various processes in the semiconductor industry (and other industries). For example, etching of semiconductor substrates may use an RF plasma that could cause damage to electronic components.

Therefore, there is a need for a PCMD that has shielding that allows the PCMD to operate in an environment having high-energy electromagnetic radiation. There is also a need for such a PCMD to operate in an environment where etching of material from the PCMD may occur, without the etched material contaminating the processing system.

SUMMARY OF INVENTION

Electronic components of a process condition measuring device (PCMD) are sandwiched between two conductive substrate portions that are electrically connected together. The substrate portions thus form a Faraday cage around the electronic components that shields the electronic components from electromagnetic radiation. The substrate portions have the same dimensions and are made of the same or similar material to a production substrate. In particular, highly doped, conductive Silicon substrate portions may be used.

A contact pad is formed on a Silicon substrate portion by first forming a recess, placing molten Indium, or similar material, in the recess and physically scraping away Silicon dioxide that lies between the Indium in the recess and the Silicon of the substrate portion. This allows Indium to lie in direct contact with the Silicon and thus form an ohmic contact. A contact tab (of Gold, or similar material) is attached to the Indium. Electronic components are attached to the substrate portion, generally in cavities formed for them. Electronic components may be attached as a pre-assembled unit or separately attached and connected together in-situ. Thermally conductive adhesive may be used where good thermal conduction is desired, for example around temperature sensors. A second substrate portion that also has a contact pad is attached to the first substrate portion so that the electronic components are sandwiched between the substrate portions. The contact pads of the first and second substrate portions are joined using an electrically conductive adhesive so that current is free to flow through the contact pads from one substrate portion to the other. In some cases, multiple contact pads are provided on first and second substrate portions to provide good electrical contact. Alternatively, conventional Silicon processing techniques are used to etch away native oxide and deposit a conductive metal layer directly on a doped Silicon substrate so that the metal layer is in electrical contact with the doped Silicon substrate.

In some cases, sensors use pads (or other antennae) that are exposed and electronic components that are shielded. Electronic components may be sandwiched between conductive substrate portions, while pads are mounted to exterior surfaces of substrate portions. Conductive leads extend, through holes in the substrate portion, from the pads to the electronic components. Electronic components may be located in separate recesses or cavities so that electronic components are shielded from each other as well as from any external interference.

Pads may be mounted on an external surface of a substrate portion, with an insulating layer between the pad and the substrate portion. Alternatively, pads may be mounted in recesses so that a PCMD has a planar surface. In another example, pads are mounted on studs so that they are clear of the surface of a substrate portion.

A PCMD may have all electronic components and conductive leads shielded so that only pads and substrate portions are exposed. Thus, when material is eroded from the PCMD, no damage is done to electronic components or conductive leads. Also, potentially contaminating materials from electronic components and conductive leads are not eroded so that contamination of a process chamber is prevented.

Various sensing circuits use pads (or other antennae) that are exposed to a plasma or other electromagnetic phenomena. Sensing circuits may be shielded while pads are exposed. In one example, a double Langmuir probe has two pads that are exposed on the exterior of a PCMD and a circuit that is shielded within a PCMD that applies a voltage between the pads and gathers I-V data.

DETAILED DESCRIPTION OF ILLUSTRATED EMBODIMENTS

According to one embodiment of the present invention, a PCMD has electronic components located between a conductive upper portion and a conductive lower portion that are electrically connected together so that they form a single electrically continuous body. Because this electrically continuous body extends about the electronic components, it provides shielding from electromagnetic fields. Both upper and lower conductive portions may be formed so that they have similar material and dimensions to those of a production substrate. Although Silicon is generally considered a semiconductor, heavily doped (either n-type or p-type) Silicon may be considered a conductive material. Thus, a PCMD may have shielding from electromagnetic fields, without the addition of materials (such as metals) or structures (such as additional layers or covers) that would affect the PCMD's properties.

Figure 1:
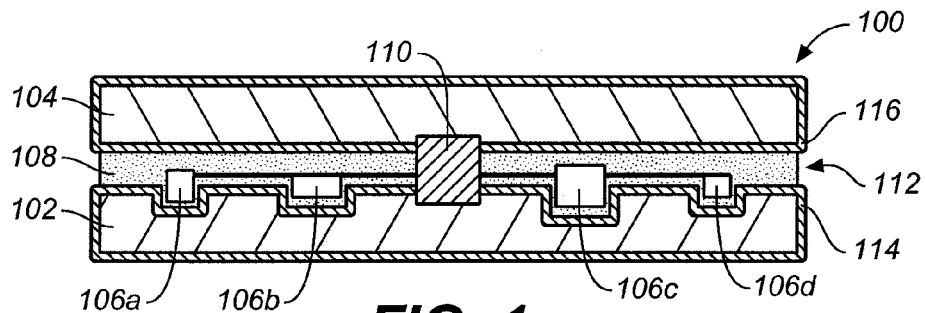
FIG. 1 shows a process condition measuring device according to an embodiment of the present invention having a conductive pathway connecting conductive substrate portions on either side of electronic components.

FIG. 1 shows an embodiment of the present invention where a PCMD 100 is formed from two substrate portions connected together to enclose electronic circuits used to measure processing conditions. A first substrate portion 102 has recesses for electronic components 106a-d, which may include sensors, batteries, communication circuits, data processing circuits and power transfer circuits (e.g. an induction coil). A second substrate portion 104 overlies first substrate portion 102 and electronic components 106a-d. Second substrate portion 104 is attached to first substrate portion 102 by adhesive 108. In addition, second substrate portion 104 is attached to first substrate portion 102 by at least one electrically conductive pathway 110 so that electrical current is free to flow from first substrate portion 102 to second substrate portion 104. Thus, first and second substrate portions 102, 104 and conductive pathway 110 form a single conductive shield that extends around the electronic components 106a-d. In order to provide shielding from electromagnetic fields, it is not necessary that a conductive shield is gap-free. If gaps are sufficiently small given the wavelength of the electromagnetic disturbance, then such gaps have little effect. In the example of FIG. 1 an adhesive-filled gap 112 exists where first substrate portion 102 and second substrate portion 104 are joined together by adhesive 108. Adhesive 108 may not be in electrical contact with first and second substrate portions 102, 104 because of a native oxide layer 114 on first substrate portion 102 and a similar native oxide layer 116 on second substrate portion 104 (and in some cases, the nature of adhesive 108) so that gap 112 exists in the shield formed by the first and second substrate portions 102, 104. However, gap 112 is generally less than 0.001 inches (30 microns), which is much smaller than the wavelength of the RF radiation generally found in industrial substrate processing systems. In other examples, gap 112 may be bigger without allowing significant RF, or other electromagnetic radiation that could cause interference, to reach electronic components.

In the example of FIG. 1, PCMD 100 has a diameter that is equal to that of a production substrate made of semiconductor material such as Silicon. Thus, the diameter may be 300 millimeters, 200 millimeters 150 millimeters or any other standard size. It should be noted that FIG. 1, and other drawings of the present application are not intended to be drawn to scale and the relative sizes of certain features are modified to more clearly illustrate aspects of the present invention. First substrate portion 102 and second substrate portion 104 are formed of Silicon so that they have similar physical properties to those of production substrates. In addition, first substrate portion 102 and second substrate portion 104 are doped so that they are electrically conductive. Silicon wafers may be doped by diffusion, implantation or any other suitable method to have sufficient dopant concentration to give good electrical conductivity. In one example, crystal melt doping is used to dope one or both substrate portions 102, 104. Suitable dopants include N-type, such as Arsenic or Phosphorus, and P-type, such as Boron. First substrate portion 102 and second substrate portion 104 may be doped to a saturation level to get a high conductivity, or may be doped to some lower level. In this example, first substrate portion 102 and second substrate portion 104 are heavily doped with p-type dopant and are considered P+ substrate portions. The height of the PCMD may be the same as the height of a standard sized substrate. However, in some cases the height is greater because of the addition of electronic components. The first and second substrate portions 102, 104 may be formed from Silicon substrates that are thinned by mechanical or chemical means, or by a combination of chemical and mechanical means so that their combined thickness is less than twice the thickness of a production substrate, and may be equal to the thickness of a production substrate in one example. For example, a first substrate portion may be approximately 750 microns thick (approximately 30 mils) and a second substrate portion may be approximately 380 microns thick (approximately 15 mils). US Patent Publication No 2004/0225462 describes certain process condition measuring devices and methods of making and using them.

Silicon generally grows a native oxide (a layer of Silicon dioxide). Native oxide may form on any Silicon surface exposed to air, even at room temperature, because of oxidation of Silicon by Oxygen in the air. Typically, native oxide thickness is approximately 10-20 Angstroms. Silicon dioxide is not a good electrical conductor and a surface connection to a Silicon substrate that is formed on Silicon dioxide layer is not generally ohmic. Thus, simply bonding first substrate portion 102 and second substrate portion 104 together without removing native oxide layers 114, 116 would generally not provide a good electrical connection between first substrate portion 102 and second substrate portion 104. Therefore, in the example of FIG. 1, native oxide layer 114 that coats first substrate portion 102 is removed from an area of the first substrate portion 102 and native oxide layer 116 that coats second substrate portion 104 is removed from an area of second substrate portion 104 so that a good electrical connection may be formed. One process for removing Silicon dioxide and forming an electrical connection to a substrate portion is described in detail below, however alternative processes may also be used.

Figure 2A:
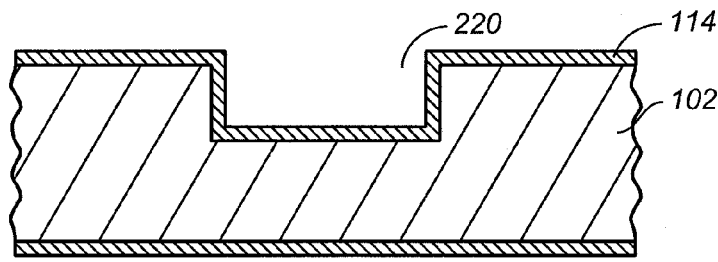
FIG. 2A shows a recess formed in a surface of a substrate portion.

FIG. 2A shows part of first substrate portion 102 of FIG. 1 at an earlier stage of fabrication, prior to connection with the second substrate portion 104. FIG. 2A shows a recess 220 formed in a surface of first substrate portion 102. Recess 220 may be formed by any suitable method, for example by mechanical abrasion or by wet or dry etching. While native oxide layer 114 may be removed from the recessed area during formation of recess 220, native oxide layer 114 grows back rapidly so that surfaces of recess 220 and other surfaces of first portion 102 are generally coated by native oxide layer 114 at this stage. In one example, recess 220 is circular and is approximately 0.17 inches (4.3 millimeters) in diameter.

Figure 2B:
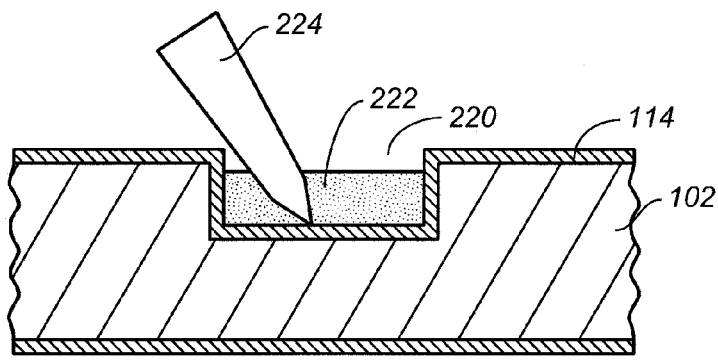
FIG. 2B shows a stylus scratching away native oxide from the Silicon surface in the recess of FIG. 2A while Indium is in the recess overlying exposed Silicon.

FIG. 2B shows first substrate portion 102 of FIG. 2A at a subsequent stage of fabrication. Recess 220 is at least partially filled with molten Indium (In) 222, which has a melting point of approximately 156 degrees Centigrade. First substrate portion 102 and Indium 222 may be heated above the melting point of Indium using a hot plate or other suitable heating apparatus. While Indium 222 is still in a liquid state, a stylus 224 is used to scratch the underlying native oxide layer 114. As stylus 224 scratches away portions of native oxide layer 114, the underlying Silicon is exposed. However, because no oxygen or other oxidizing agent is in contact with the exposed Silicon, it does not re-grow a native oxide. Instead, Indium 222 flows into any scratches in the Silicon surface and forms a direct contact with the Silicon of first substrate portion 102. Indium 222 is a good electrical conductor and forms an ohmic contact with P-type Silicon of first substrate portion 102. For n-type Silicon substrates, Antimony may be used instead. Scratching the Silicon with a stylus also creates a roughened surface and thus increases the surface area between Silicon and Indium. In one example, an ultrasonic dental tool is used as the stylus so that Silicon dioxide is efficiently removed.

Figure 2C:
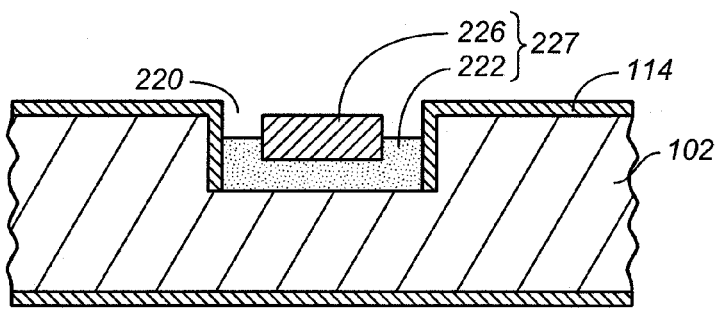
FIG. 2C shows the Indium of FIG. 2B in direct contact with underlying Silicon and a conductive tab attached to the Indium.

FIG. 2C shows first substrate portion 102 of FIG. 2B at a subsequent stage of fabrication. A conductive tab 226 (of Gold in this example) is attached to Indium 222. Typically, conductive tab 226 is applied to Indium 222 while it is still in a liquid state. Mechanical scrubbing breaks any Indium oxide that is present on the top surface of Indium 222 and a Gold-Indium alloy may form at an interface between the metals. First substrate portion 102 is then allowed to cool. In one example, a conductive tab is formed of Gold and measures 0.05×0.07 inches (1.3×1.8 millimeters). FIG. 2C shows no native oxide remaining along the bottom of recess 220 as a result of scratching by stylus 224. In practice, some oxide may remain in this area, but scratching of the Silicon surface at the bottom of recess 220 provides enough area of direct Indium-Silicon contact to have a good electrical contact.

First substrate portion 102 of FIG. 2C has a conductive tab 226 that is in good electrical contact with first substrate portion 102 through the Indium 222. Because Gold does not form an oxide layer, conductive tab 226 on Indium 222 forms a contact pad 227 that can be used to form an electrical connection to another component at a later time, without requiring additional cleaning. In contrast, if only Indium 222 were used, an Indium oxide layer could affect any connection made to such a contact pad. Second substrate portion 104 undergoes a similar process to that shown in FIGS. 2A-2C so that it too has a contact pad.

Figure 3A:
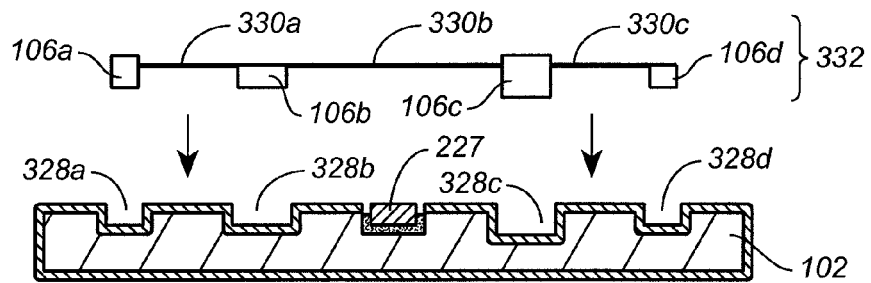
FIG. 3A shows a pre-assembled electronics unit being attached to the substrate portion of FIG. 2C.

Cavities 328a-d are formed in first substrate portion 102 to contain electronic components 106c-d as shown in FIG. 3A. Cavities 328a-d may be formed in the same manner as a recess for an electrical contact pad or in a different manner. In one example, cavities 328a-d are formed for electronic components 106a-d and for electrical conductors 330a-c between electronic components 106a-d. In some cases, cavities may be formed in both a first and a second substrate portion to accommodate electronic components. FIG. 3A shows first substrate portion 102 with cavities 328a-d for electronic components 106a-d and a contact pad 227 for connection to second substrate portion 104. FIG. 3A also shows first substrate portion 102 before a pre-assembled electronics unit 332 is attached to first substrate portion 102. In some examples, electronic components are formed in or on a first substrate portion using conventional semiconductor processing techniques. In other examples, components, such as sensors, processing circuits and communication circuits are individually attached to a first substrate portion and are connected together once they are in place.

FIG. 3A shows an embodiment where electronic components 106a-d are provided in a pre-assembled unit 332 that can easily be put in place. Such a pre-assembled unit is described in US Patent Publication No. 2004/0225462. Pre-assembled unit 332 may be secured in place by attaching it to first substrate portion 102 using adhesive. Adhesive is generally applied so that it fills portions of cavities 328a-d not occupied by parts of pre-assembled electronic unit 332. In some examples, a thermally conductive adhesive is used to attach at least some of electronic components 106a-d to first substrate portion 102. A thermally conductive adhesive may have thermal characteristics that are close to the thermal characteristics of Silicon. For example, temperature sensors may be attached using thermally conductive adhesive so that their temperatures accurately reflect the temperature of the substrate portion to which they are attached. All electronic components may be attached using thermally conductive adhesive in some cases. In this way, thermal energy flows freely through a PCMD in a manner that is similar to thermal energy flow through a production substrate. One example of a thermally conductive adhesive is an epoxy with powdered diamond in it.

Figure 3B:
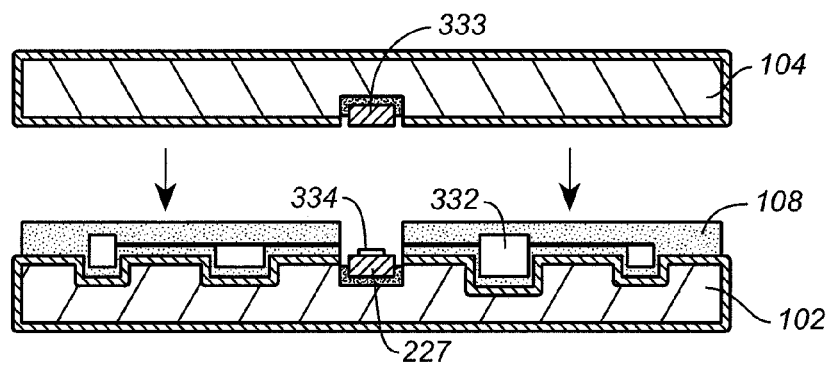
FIG. 3B shows a second substrate portion being attached to the first substrate portion and pre-assembled unit of FIG. 3A.

Subsequent to attaching pre-assembled electronic unit 332, second substrate portion 104 is attached to first substrate portion 102. In particular, as shown in FIG. 3B, first substrate portion 102 and second substrate portion 104 are placed so that their respective contact pads 227, 333 are facing each other. An electrically conductive adhesive 334 is applied to one or both contact pads 227, 333. For example, a Silver (Ag) epoxy may be applied, and then contact pads 227, 333 are brought into contact. In addition, a flexible adhesive 108 (for example, a silicone based adhesive) is applied to other surfaces of first substrate portion 102 and second substrate portion 104 as required, ensuring good adhesion between the two substrate portions and pre-assembled electronics unit 332 between them. As first substrate portion 102 and second substrate portion 104 are pressed together, excess adhesive 108 is squeezed out and a generally void-free layer of adhesive joins the first and second substrate portions 102, 104. First and second substrate portions 102, 104 are electrically connected where their contact pads 227, 333 are attached by electrically conductive adhesive 334. First substrate portion 102 and second substrate portion 104 are thermally connected at least where electronic components are attached by thermally conductive adhesive. Thus, first and second substrate portions 102, 104 may have good electrical and thermal contact between them and therefore have similar thermal and electrical characteristics to a doped Silicon wafer of the same size. Pre-assembled electronic unit 332 has good thermal contact with both first substrate portion 102 and second substrate portion 104. However, pre-assembled electronic unit 332 is electrically insulated from first substrate portion 102 and second substrate portion 104 both by polymer strips that insulate conductors of the pre-assembled electronic unit, and by native oxide layers 114, 116 on first and second substrate portions 102, 104. In some cases, first and second substrate portions may be subject to oxidation to grow a thick oxide layer to further electrically insulate the pre-assembled electronic unit from the first and second substrate portions. Such oxidation may be performed in a furnace. In one example, a 2 micron layer of Silicon dioxide is grown in this way.

Because pre-assembled electronic unit 332 is between first substrate portion 102 and second substrate portion 104, pre-assembled electronic unit 332 is protected from electromagnetic radiation by first substrate portion 102 and second substrate portion 104. The joined first and second substrate portions 102, 104 form a Faraday cage that encloses pre-assembled unit 332 and protects it from electromagnetic radiation. Clearly, this system of protecting electronic circuits is not limited to pre-assembled units but can shield any circuits placed between the first and second substrate portions. Not only are electronic circuits shielded, other non-electronic components that might be damaged by processing conditions are also protected.

Figure 4:
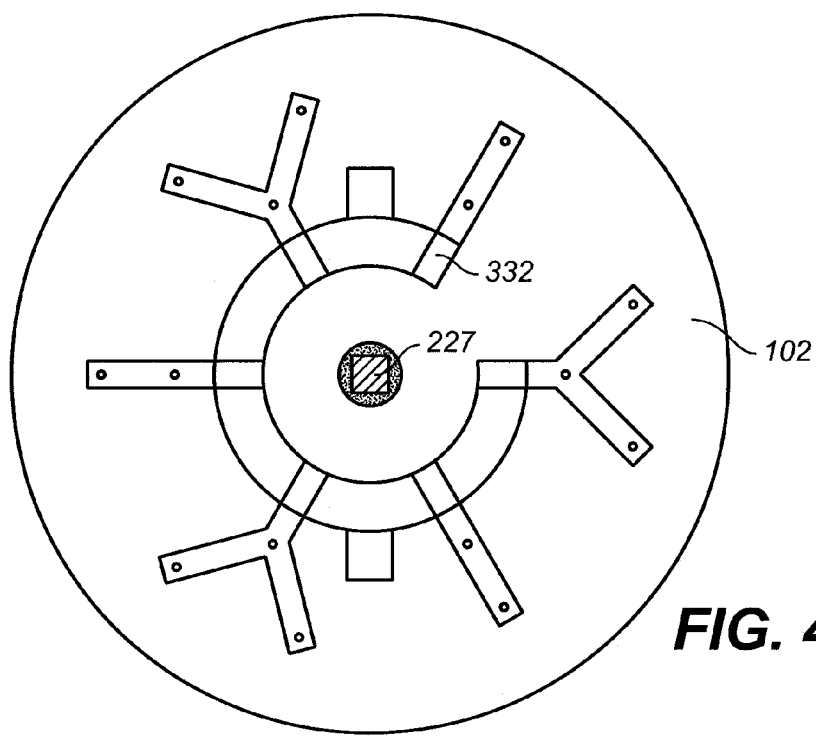
FIG. 4 shows a top-down view of the first substrate portion and pre-assembled electronics unit of FIGS. 3A and 3B.

In one example, a pre-assembled electronic unit includes a plurality of sensors arranged in a geometrical pattern so that they are widely dispersed across the first substrate portion. Such sensors may sense temperature or some other process conditions at different points across the substrate. In addition, a pre-assembled electronic unit may include electronic components such as a microprocessor, a memory circuit, communications circuit or other circuits. Electrical leads encapsulated in an insulator may connect the electronic components of the pre-assembled unit. FIG. 4 shows a top-down view of pre-assembled electronic unit 332 mounted to first substrate portion 102. Contact pad 227 is located in the center of first substrate portion 102. However, in other embodiments, the center of a first substrate portion may be used for other components (e.g. an induction coil or other power or communication related components). In such embodiments, at least one contact pad may be provided at a location that is not the center of the first substrate portion. In one example, a 300 millimeter diameter Silicon substrate portion is provided with eight contact pads at locations spread out across a first substrate portion. Contact pads are also provided at corresponding locations on a second substrate portion so that connection between the first and second substrate portions occurs at a number of locations.

Figure 5:
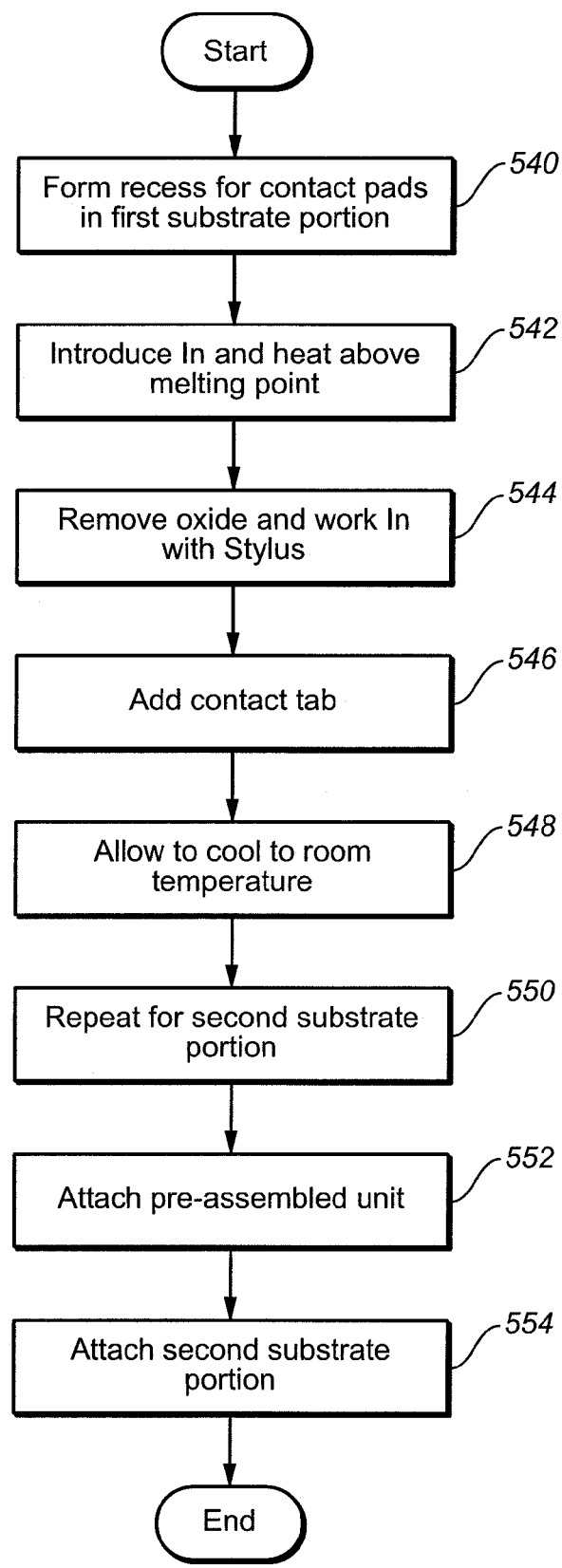
FIG. 5 shows a flowchart of an exemplary process of making a process condition measuring device with shielding.

FIG. 5 shows a flowchart for forming a process condition sensing wafer according to an embodiment of the present invention. In a first step, a recess is formed 540 in the first substrate portion at a location where a contact pad is to be placed. The recess may be formed by any suitable method. Machining the recess may create some surface roughness that is helpful for forming a good contact. Next, Indium is introduced 542 into the recess and the first substrate portion and the Indium are heated to a temperature above the melting point of Indium (approximately 156 degrees Centigrade). A stylus is used 544 to remove the Silicon dioxide layer between the Indium and the Silicon of the first substrate portion. By working the Indium into the Silicon a good contact is formed and scratching of the Silicon may add surface area to improve the contact. Next a conductive tab is attached 546 to the Indium. The first substrate portion is allowed to cool to room temperature 548 and the same contact pad formation process is carried out on a second substrate portion 550. A pre-assembled unit is attached to the first substrate portion 552. Thermally conductive adhesive may be used, at least for temperature sensors. The second substrate portion is then attached 554 to the first substrate portion with electrically conductive adhesive applied to opposing contact pads. Another adhesive (e.g. Silicone adhesive) may be used for attaching the remaining surface areas of the first and second substrate portions.

A PCMD having substrate portions joined in the manner described above is generally able to undergo rapid temperature cycles without damage. In particular, because first and second substrate portions are made of the same material they expand and contract at the same rate. Also, because there is generally good thermal conduction throughout the PCMD, large temperature differences do not generally occur. When temperature differences between components do occur, some flexibility is provided by contact pads that have Indium and Gold portions. Both Indium and Gold are relatively soft metals and so contact pads do not tend to exert large forces on first or second substrate portions but instead deform somewhat to allow for relative movement between components. A Silicone based adhesive between the first and second substrate portions is also flexible to allow for some movement between components.

In addition to the above embodiment, various other methods of attaching substrate portions so that they are linked by a conductive path may be used. Platinum or Gold may be used in place of Indium, though their higher melting points require higher temperature formation of the contact pad. Antimony may be used to form an ohmic contact to n-type substrates. A conductive tab may be formed of a material other than Gold. Any metal that does not form an oxide and forms an alloy with Indium (or otherwise forms a good contact with the underlying material) may be used. For example, Platinum, Palladium or similar metals may be used. Alternatively, a conductive tab may only be coated in a metal such as Gold, Platinum or Palladium, with a different material underneath. Conventional semiconductor processing techniques may be used to remove Silicon dioxide in a vacuum or inert gas environment and then deposit a metal layer directly on doped Silicon. For example, it is conventional to perform an in-situ etch on a substrate before sputtering a metal layer onto a substrate. This means that any native oxide is removed from the substrate immediately prior to sputtering. Etching may be performed in the same chamber where sputtering is performed, or in a different chamber of the same system. In either case, the substrate remains under vacuum (or in inert ambient) between etching and sputtering so that no native oxide grows and the sputtered metal layer directly contacts the substrate material. One advantage of such a method is that recesses may not be needed.

In one embodiment of the present invention, sensors may be placed outside of the volume that is shielded by substrate portions. For example, where energy density of a plasma is to be measured or where etch rate of an etch process is to be measured, sensors may be placed so that they are exposed to electromagnetic fields. However, other components may still be protected by a shield. For example, sensors may be placed on an outer surface of a substrate portion, but electronic components such as a microprocessor or a battery may be between electrically connected substrate portions so that they are protected. In this way, sensors are placed so that they can accurately measure process conditions while sensitive electronic components are protected. Some sensors may be placed so that they are shielded while others are not. For example, an etch-rate sensor may be exposed while a temperature sensor in the same PCMD may be shielded. Thus, not all electronic components are necessarily shielded. For a component to be shielded, it is not required that the component be completely surrounded by shielding, openings in the shielding may be present provided that the openings are small in relation to the wavelength of the electromagnetic radiation against which the component is shielded. Thus, a small opening may allow a sensor to accurately measure an environmental condition without being exposed to potentially harmful radiation. For example, an opening might stop RF radiation, but allow light through to a photo sensor.

While the above examples show the first and second portions having equal dimensions along a horizontal plane (Silicon substrate portions of equal diameter), this may not always be the case. As long as one substrate portion has the dimensions of a production substrate, the substrate may be handled as a production substrate by automated equipment and may have sufficiently similar physical characteristics. Thus, a first substrate portion may be similar to a production substrate, while a second substrate portion does not necessarily have the same diameter. The second substrate portion may extend as a lid over electronic components, but does not necessarily extend over the entire first substrate portion.

The above examples refer to doped Silicon as the material of first and second substrate portions. However, other materials may also be used. For example, Gallium Arsenide (GaAs) substrate portions may be used and may not require removal of native oxide in order to form contact pads. In some cases, a Silicon substrate portion may include a heavily doped layer that is conductive, while the rest of the substrate portion is undoped and generally non-conductive. Connection to such a conductive, doped layer may be sufficient to provide shielding. In some cases, metal substrate portions may be used instead of Silicon. While Silicon is particularly suitable for some measurements, metal substrate portions provide good shielding from electromagnetic radiation and may be used in some circumstances. Substrate portions in the same PCMD may be formed of different materials in some cases. One advantage of Silicon is that it does not cause contamination where it is used in a processing system that regularly process Silicon production substrates. Even where a PCMD having Silicon substrate portions is etched, the exposed surfaces are Silicon, so the removed material is the same as for a production substrate. If metal were used in this location, metal removed by etching could contaminate the etch chamber. If a process condition such as gas flow in a non-corrosive environment is being measured, metal substrate portions may be used.

Figure 6:
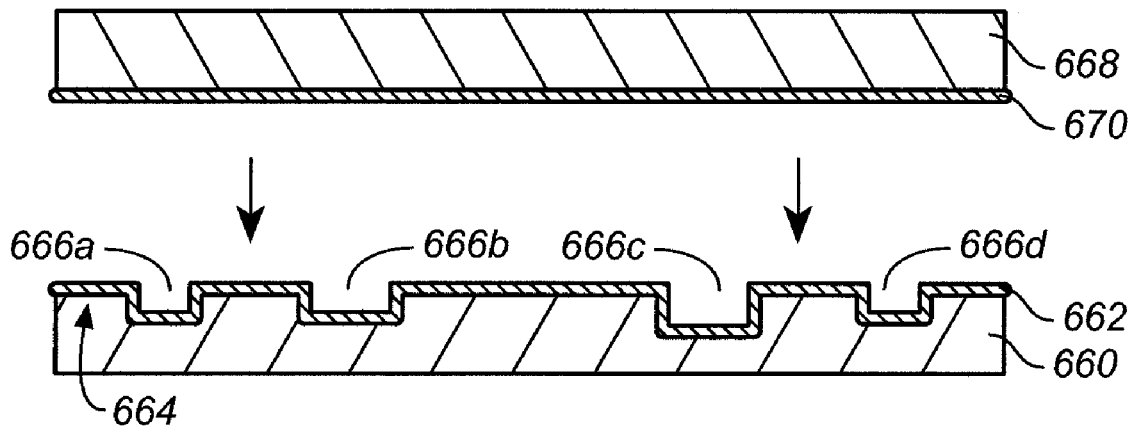
FIG. 6 shows separated first and second flat panel display substrate portions having conductive layers.

In one embodiment, a substrate portion formed from an electrically insulating material has a conductive layer formed that provides shielding. FIG. 6 shows a first Flat Panel Display (FPD) substrate portion 660 made of glass, having a conductive layer 662 formed over an upper surface 664. Conductive layer 662 may be a metal that is deposited (by sputtering, for example). It is advantageous to use a metal such as Gold that does not form a native oxide so that electrical contacts are more easily formed. FIG. 6 also shows cavities 666a-d formed in surface 664 so that electronic components can be located in cavities 666a-d. Conductive layer 662 is deposited so that it coats surfaces of cavities 666a-d. A second FPD substrate portion 668 is also formed from glass with a conductive coating 670 in this example. In some other examples, a second substrate portion may be formed of a different material to first substrate portion 660. As before, first substrate portion 660 and second substrate portion 668 are joined together with electronic components between them.

Figure 7:
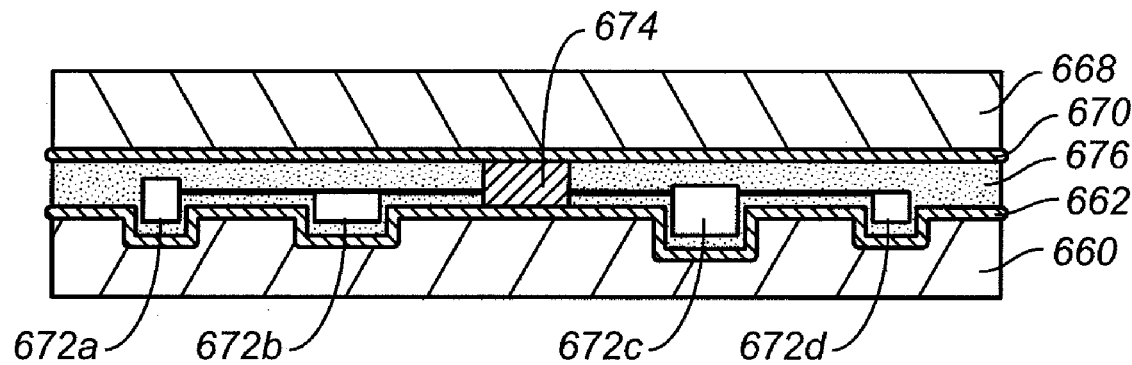
FIG. 7 shows the first and second flat panel display substrate portions of FIG. 6 joined by a conductive pathway and enclosing electronic components.

FIG. 7 shows first substrate portion 660 and second substrate portion 668 of FIG. 6 with electronic components 672a-d between them and a conductive pathway 674 connecting conductive layers 662, 670 of first and second conductive portions 660, 668. Conductive pathway 674 in this example may simply be an electrically conductive adhesive applied at a location between first substrate portion 660 and second substrate portion 668. Other adhesive 676 that is not necessarily electrically conductive is applied elsewhere between substrate portions 660, 668. Because Gold, or similar metal, is used to form conductive layers 662, 670, no oxide is present on the surfaces of conductive layers 662, 670 and electrically conductive adhesive forms a direct electrical connection to the conductive layers 662, 670. Thus, electrical current is free to flow between electrically conductive layers 662, 670, and they form a Faraday cage around electronic components 672*a-d*. As before, a gap in the shielding exists where non-conductive adhesive 676 is used between conductive layers 662, 670. However, because this gap is small compared to the RF radiation from which components 672*a-d* are being shielded, no significant RF radiation is experienced by electronic components 672*a-d*. While FIGS. 6 and 7 show all of surface 664 of first substrate portion 660 covered by conductive layer 662, in other examples, only part of surface 664 may be covered. Thus, for a FPD substrate, it may be sufficient to have a conductive layer at particular locations where sensitive components are to be placed and not elsewhere. In other embodiments, a conductive layer on a non-conductive first substrate portion is connected to a second substrate portion that is conductive (metal, doped Silicon or other conductive material).

In one embodiment, a Silicon substrate portion that is not formed of highly conductive material has a conductive layer formed on it to provide shielding. An undoped or lightly doped P-type Silicon wafer (P⁻ wafer) is used to form a substrate portion, which has a conductive layer formed on it. Connection between the conductive layer and the rest of the substrate portion may be provided as described before. Alternatively, no connection may be needed where sufficient shielding is provided by the conductive layer alone. Such P⁻ material may be optically transparent at certain wavelengths in the visible and/or infrared portions of the spectrum. Openings may be provided in the conductive layer to allow selected radiation to pass through the conductive layer. For example, an infrared sensor may be located so that it is protected from RF radiation by the conductive layer, but an opening in the conductive layer provides an infrared-transparent window for the sensor to accurately measure infrared radiation incident on the substrate portion. Such a substrate portion may be connected to another substrate portion that is made of conductive material, or includes a conductive film to form a Faraday cage as described before.

In one example, a substrate portion includes a conductive layer formed by removing native oxide using a sputter etch and then sputtering a conductive metal layer over the substrate portion while maintaining the substrate portion under vacuum so that native oxide does not grow back. The metal layer may be patterned by conventional lithographic techniques to provide openings to create an eddy current break and allow coupling to a secondary indicator coil in an RF transformer beneath the conductive metal layer without compromising the electrostatic shielding. The geometry of the openings can be narrow enough to allow breakage of the DC current yet small enough to prevent electrical field passage due to the small geometry. Openings in such a conductive layer may allow inductive coupling to occur between an induction coil that is protected by the conductive layer and another induction coil that is placed near the substrate. In this way, an electronic unit that includes an inductive coil and is protected by a Faraday cage may be supplied with power by inductive coupling across the conductive layer.

In one example, a conductive layer is provided that is electrically conductive but is optically transparent. Such a conductive layer provides protection from interfering radiation such as RF, while allowing radiation of optical wavelengths to pass through so that such radiation may be measured by a sensor. Examples of suitable materials providing electrical conductivity and optical transparency include Tin Oxide ($SnO_2$) and Indium Tin Oxide (a mixture of Indium Oxide $In_2O_3$ and Tin Oxide $SnO_2$).

Various embodiments of the present invention may be used for measuring process conditions in a harsh environment such as a process chamber that contains a plasma. Generally, such measurements are made by placing a sensor in a position where it is exposed to the harsh environment. However, other components of a PCMD may be shielded from the harsh environment. In particular, where the environment includes an RF plasma or other potentially disturbing electromagnetic radiation, certain components may be located between conductive substrate portions that are electrically connected to form a Faraday cage. Certain sensors used to sense electromagnetic conditions (such as ion current density, surface charge or electron temperature) use pads or other conductive elements that may act like antennae to provide an output through a conductive path. The sensor may be exposed to a plasma or other harsh environment, while the conductive path and electronic components are shielded.

Figure 8:
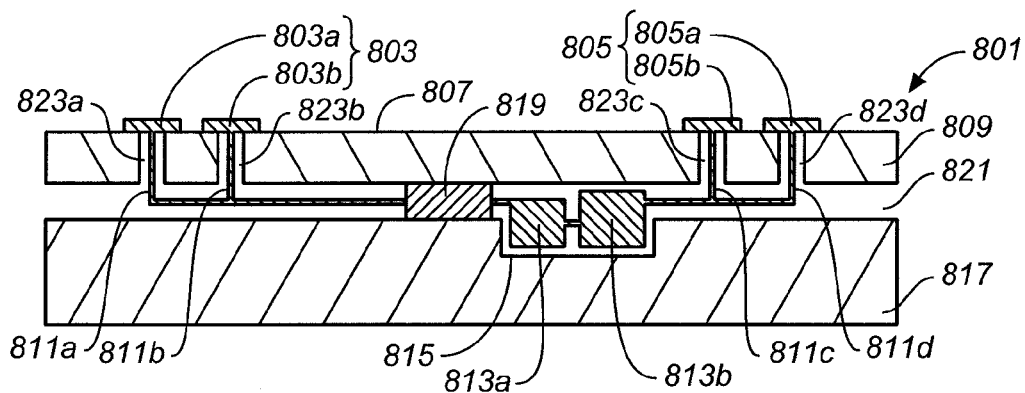
FIG. 8 shows a PCMD having electronic components that are shielded and sensors that are not shielded.

FIG. 8 shows a cross section of a PCMD 801 having two sensors 803, 805, with each sensor having two pads 803*a*, 803*b*, 805*a*, 805*b*. Pads 805*a-b*, 805*a-b* are formed on a surface 807 of a first conductive portion 809 with an insulating layer between first conductive portion 809 and pads 803*a-b*, 805*a-b*. First conductive portion 809 may be have a deposited or bonded-on insulating layer prior to attaching pads 803*a-b*, 805*a-b*. For example, a Silicon conductive portion may have a thick Silicon Dioxide layer grown or may have a dielectric layer spun-on or applied by CVD. In this way, pads 803*a-b*, 805*a-b* are electrically insulated from first conductive portion 809. Pads may be formed by thin film deposition techniques (sputtering, CVD etc) or may be formed as discrete components and manually attached. Pads may be made of metal, doped Silicon or any suitable conductive material. Conductive leads 811*a-d* extend from the underside of pads 803*a-b*, 805*a-b* to connect the pads to electronic components 813*a-b*. Electronic components 813*a-b* may receive input from the pads and process the input to provide data, which are then stored or transmitted (or both stored and then transmitted) for analysis. Electronic components 813*a-b* are shown located in a recess 815 in a second conductive portion 817. Because first and second substrate portions 809, 817 are electrically connected by a conductive pathway 819, electronic components 813*a-b* are effectively shielded from radiation from outside first and second substrate portions 809, 817. In addition, conductive leads 811*a-d* extend within gap 821 between first and second substrate portions 809, 817 and are therefore also shielded from radiation from outside the first and second substrate portions. This generally reduces or eliminates the tendency of conductive leads to act as antennae that pick up electromagnetic signals. Conductive leads 811*a-d* may also be located in trenches formed in the first substrate portion 809 or second substrate portion 817. A signal received by electronic components 813*a-b* from conductive leads 811*a-d* generally has less noise than if conductive leads 811*a-d* were unshielded. Holes 823*a-d* extend through first substrate portion 809 to allow leads 811*a-d* to connect to pads 803*a-b*, 805*a-b*. Holes 823*a-d* may be made of a small diameter so that significant RF radiation does not pass through a hole to the interior of the PCMD. The inside surface of a hole, like other surfaces of first substrate portion 809, is generally coated with an insulating layer formed by oxidation or otherwise on the surfaces of the hole or on the surfaces of the lead entering below the pad.

Figure 9:
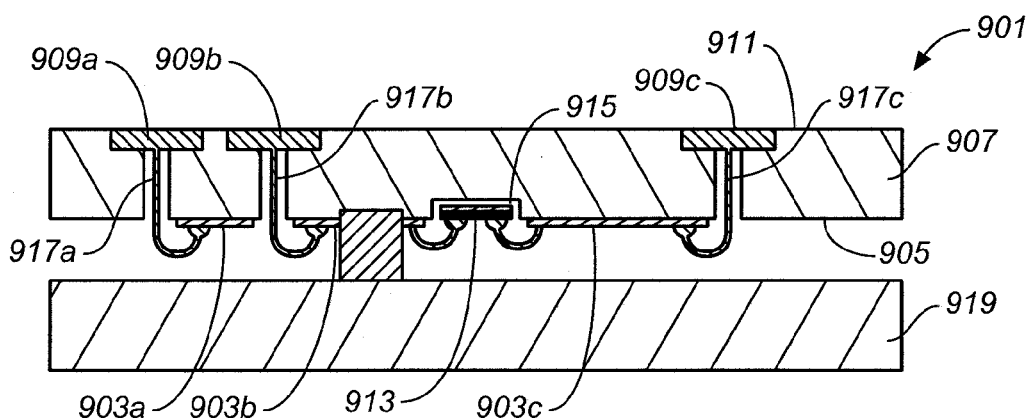
FIG. 9 shows another PCMD having electronic components that are shielded and sensors that are not shielded, with sensor pads that are flush with a surrounding surfaces so that the PCMD has a planar surface.

FIG. 9 shows a PCMD 901 according to an alternative embodiment. In this embodiment, conductive leads are formed as traces 903a-c on a first surface 905 of a first substrate portion 907 and pad 909a-c are formed on the opposite second surface 911 of first substrate portion 907. Traces 903a-c may be formed by any suitable technique. Generally, an insulating layer is formed on a first substrate portion, and then a conductive layer (of metal or other suitable conductor) is formed and patterned to form traces. Alternatively, trenches may be etched in a first substrate portion, then an insulating layer is formed and a conductive layer is formed over the insulating layer. Then, planarization is performed to leave conductive material only in the trenches. An electronic component 913 is shown in a recess 915 in first substrate portion 907. Electronic component 913 is formed as a discrete component and is then placed in recess 915 so that it does not extend beyond surface 905 of first substrate portion 907. Pads on the electronic component 913 may be attached to traces 903a-c by wire bonding or similar techniques. In other examples, electronic components may be formed in-situ by conventional semiconductor processing techniques. Thus, where the first substrate portion is formed of Silicon, electronic components may be formed in the first substrate portion by conventional Silicon processing techniques. Conductive leads 917a-c from pads 909a-c may also be connected to traces 903a-c near where conductive leads 917a-c pass through first substrate portion 907. Alternatively, semiconductor-processing techniques may be used to form a conductive plug extending from a pad to a trace. Pads 909a-c are formed so that they have upper surfaces that are flush with upper surface 911 of first substrate portion 907 in this embodiment. Such pads may be formed in-situ, or may be formed and then put in place. As before, insulation is provided between pads 909a-c and first substrate portion 907. While the embodiment of FIG. 9 shows traces 903a-c and electronic component 913 attached to first substrate portion 907, in other embodiments they may be attached to the second substrate portion 919. In some cases, first and second substrate portions are interchangeable so that pads, conductive leads and electronic components may each be attached to either substrate portion. In some cases, at least one sensor may be attached to a first substrate portion and at least one sensor may also be attached to a second substrate portion.

Figure 10:
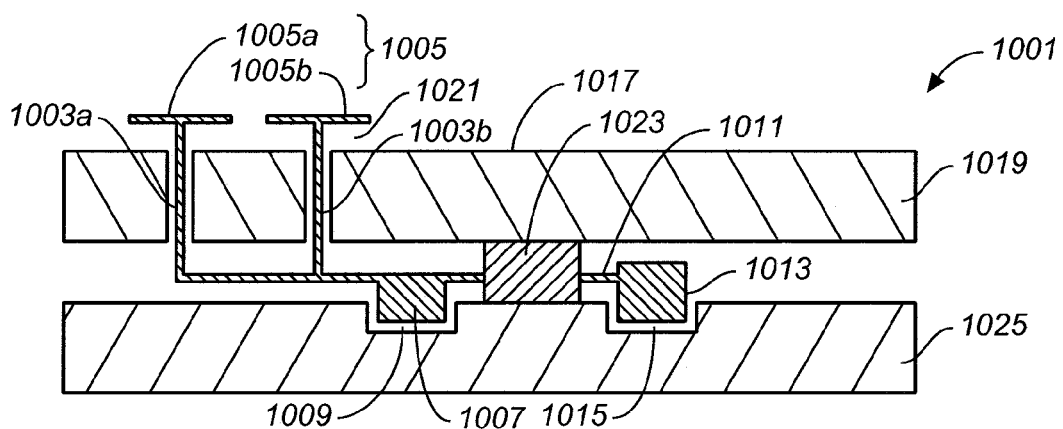
FIG. 10 shows another PCMD having electronic components that are shielded and sensors that are not shielded, with separate shielded chambers formed for different electronic components, chambers being shielded from each other as well as being shielded from external fields.

FIG. 10 shows a PCMD 1001 according to an alternative embodiment, having first conductive leads 1003a-b from a sensor 1005 going to a first electronic component 1007 in a first recess 1009. Second conductive leads 1011 connect the first electronic component 1007 to a second electronic component 1013 in a second recess 1015. There are no direct connections between sensor 1005 and second electronic component 1013. In this way, second electronic component 1013 is additionally shielded from electromagnetic radiation. In particular, some RF signal may be carried through first conductive leads 1003a-b and may reach first electronic component 1007. However, because second electronic component 1013 is not directly connected to first conductive leads 1003a-b and is located in a separate recess 1015, this signal does not reach second electronic component 1013 (or reaches it in an attenuated form). First recess 1009 may be considered to form a first Faraday cage and second recess 1015 may be considered to form a second Faraday cage. Thus, by placing separate components in separate recesses, noise may be limited to certain areas. In one example, a first electronic component includes filtering capability so that a noisy signal is received by the first electronic component from the first conductive leads and a filtered (substantially noise free) signal is sent by the first electronic component over the second conductive leads to a second electronic component. For example, the first electronic component may include an RF resonant choke filter. In other examples, more than two recesses may be used to provide more than two Faraday cages so that electronic components are compartmentalized to reduce noise propagation. FIG. 10 also shows pads 1005a-b extending above a surface 1017 of a first substrate portion 1019. A gap 1021 exists between pads 1005a-b and surface 1017 of first substrate portion 1019. A conductive pathway 1023 connects first substrate portion 1019 to a second substrate portion 1025 as before.

Figure 11A:
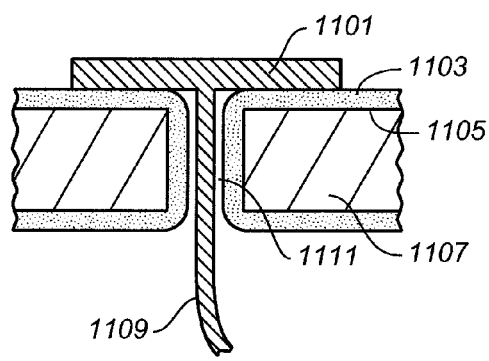
FIG. 11A shows an example of a conductive pad mounted to a substrate portion with a conductive lead extending through the conductive portion.

FIGS. 11A-11D show different options for mounting pads (or other antennae) in a PCMD. FIG. 11A shows a pad 1101 that is mounted on an insulating layer 1103 that extends over a surface 1105 of a substrate portion 1107 like that of FIG. 8. Pad 1101 may be formed by deposition, or may be a discrete component that is manually put in place. A conductive lead 1109 extends from pad 1101 to an electronic component (not shown). Conductive lead 1109 passes through a hole 1111 in substrate portion 1107. Hole 1111 is of a diameter that allows little or no RF radiation to pass through. The inside surface of hole 1111 is coated with insulating layer 1103.

Figure 11B:
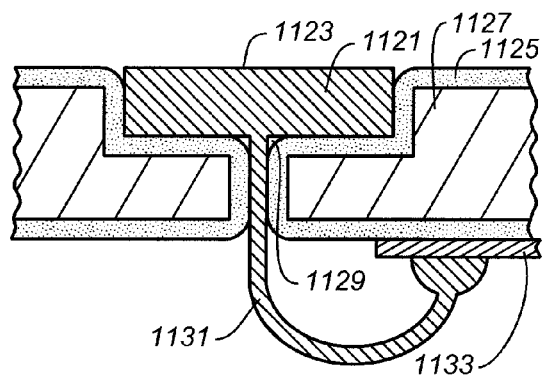
FIG. 11B shows an example of a conductive pad that is flush mounted to a substrate portion to provide a planar surface.

FIG. 11B shows an alternative pad 1121 that has an upper surface 1123 that is flush with a surface of an insulating layer 1125 on substrate portion 1127 like that of FIG. 9. A recess 1129 may be formed in substrate portion 1127 for the pad. Then, insulating layer 1125 is grown or deposited on either the substrate or the pad 1121 and then the pad 1121 is put in place. The pad 1121 may be formed by thin film deposition techniques in one example. For example, blanket deposition of metal or doped polysilicon followed by planarization may be used to provide a flat surface. A conductive lead 1131 from the pad is bonded to a conductive trace 1133.

Figure 11C:
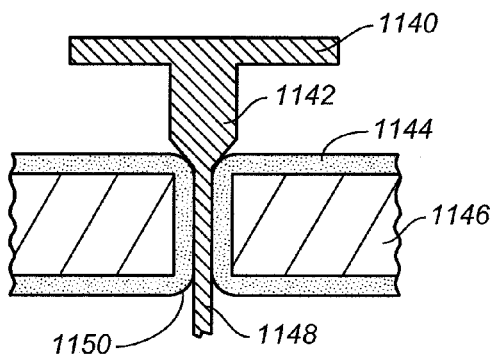
FIG. 11C shows an example of a conductive pad mounted to a substrate portion with a stud supporting the substrate portion at a distance from a surface of the substrate portion.

FIG. 11C shows an alternative pad 1140 that is mounted on a stud 1142 so that pad 1140 is above an upper surface 1144 of a substrate portion 1146. Stud 1142 provides support for pad 1140. A conductive lead 1148 passes from the stud 1142 through a hole 1150 in substrate portion 1146 to connect to an electronic component. In other examples, additional support may be provided for the pad 1140. For example, insulating support may be provided in addition to (or instead of) the stud 1142.

Figure 11D:
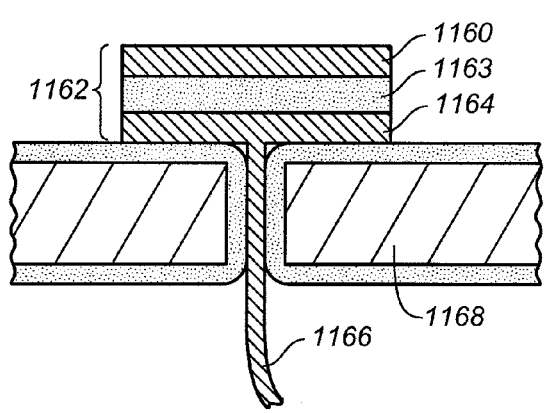
FIG. 11D shows an example of a conductive pad having a capacitor that is formed integrally with the pad.

FIG. 11D shows an alternative pad 1160 that has an integrated capacitor 1162. In some cases, it is desirable to couple a pad to an electronic component through a capacitor. In the embodiment of FIG. 11D capacitor 1162 is formed integral with the pad 1160, with the pad forming one plate of the capacitor 1162, with a dielectric layer 1163 separating pad 1160 from lower plate 1164. The pad 1160 may be formed by thin film deposition techniques. For example, a first conductive layer may be deposited, then a dielectric layer, then a second conductive layer. The example of FIG. 11D shows a capacitor that has the same area as the pad. However, in other examples, the pad may extend beyond the capacitor. Thus, the lower plate may be smaller than the pad that forms the upper plate. In this way, the capacitance may be chosen independently of the size of the pad. A lead 1166 extends through substrate portion 1168 as before.

Figure 11E:
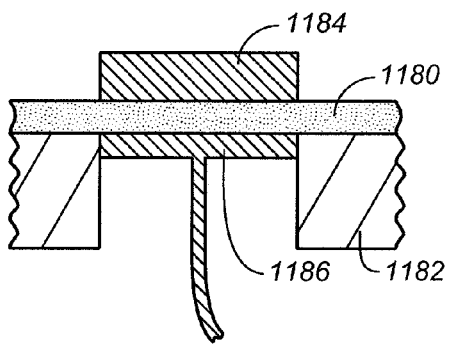
FIG. 11E shows an example of a conductive pad having an integrated capacitor using a dielectric layer grown across the substrate surface and subsequent etching from the back side.

FIG. 11E shows an alternative pad that has an integrated capacitor formed by the deposition of a thin film 1180 on the substrate portion 1182 that is subsequently formed into a suspended membrane by etching the substrate portion 1182 from the back side. Thin film conductive electrode 1184, 1186 may then be deposited on both sides of the suspended membrane with the upper electrode 1184 exposed to the plasma and the lower electrode 1186 accessible for connection to the circuitry in the cavity between the substrate portions.

Figure 11F:
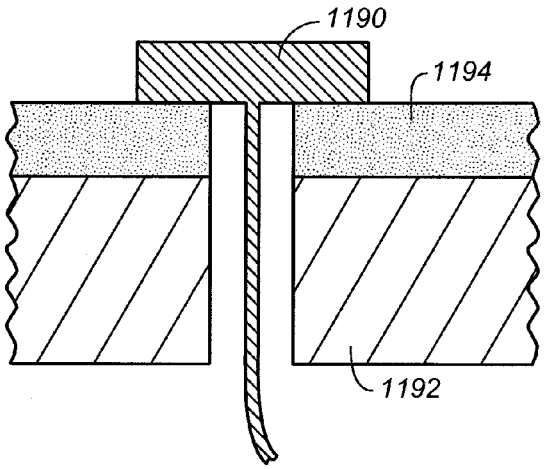
FIG. 11F shows an example of contact being made to a pad by etching through a substrate and dielectric layer from the back side.

FIG. 11F shows an embodiment that is implemented using an SOI wafer (a Silicon wafer having a thin layer of Silicon overlying a dielectric layer such as Silicon Dioxide). A pad 1190 (or antenna) is defined by patterning the Silicon layer. A hole is etched through the Silicon wafer 1192 from the back side. The hole extends through the dielectric layer 1194. Thus, contact may be made to the underside of pad 1190. Contact may be made by semiconductor-processing techniques such as metal or polysilicon plug, or may be made manually.

The different types of pads shown may be used with any arrangement of electronic components. In some cases, different types of pads may be used in the same PCMD. It will be noted that with any of the embodiments of FIGS. 8-11D, the only components exposed to the exterior environment are the first and second substrate portion and pads. A small amount of adhesive may be exposed at the edges, but generally this is not significant. As a PCMD is used, material may be removed from exposed surfaces. Thus, the first substrate portions and pads may be eroded. However, these components may be made sufficiently thick to withstand significant erosion. Also, erosion does not affect conductive leads in the configurations shown. Materials that are eroded are generally common materials used in semiconductor processing (Silicon, metal) so that a chamber in which such materials are removed is not generally contaminated by them.

Various sensor systems use pads (or antennae with other geometries) as components in circuits to measure a process conditions in a plasma. One example is a single Langmuir probe which provides a bias to an antenna and measures the current for different bias voltages. From this current/voltage (I-V) data, various characteristics of a plasma may be derived. However, single Langmuir probes generally require a ground connection (generally a connection to the chamber wall for a process chamber). It is not always convenient to provide such a ground connection to a PCMD in a process chamber.

A double Langmuir probe uses two antennae and derives process information from the I-V characteristics when a bias is applied between the two antennae. Thus, no connection to ground or other reference is required. This makes a double Langmuir probe particularly suitable for a PCMD that is used without physical connection to any other apparatus. Such PCMDs generally store data in memory for later downloading, or transmit the data wirelessly.

Figure 12:
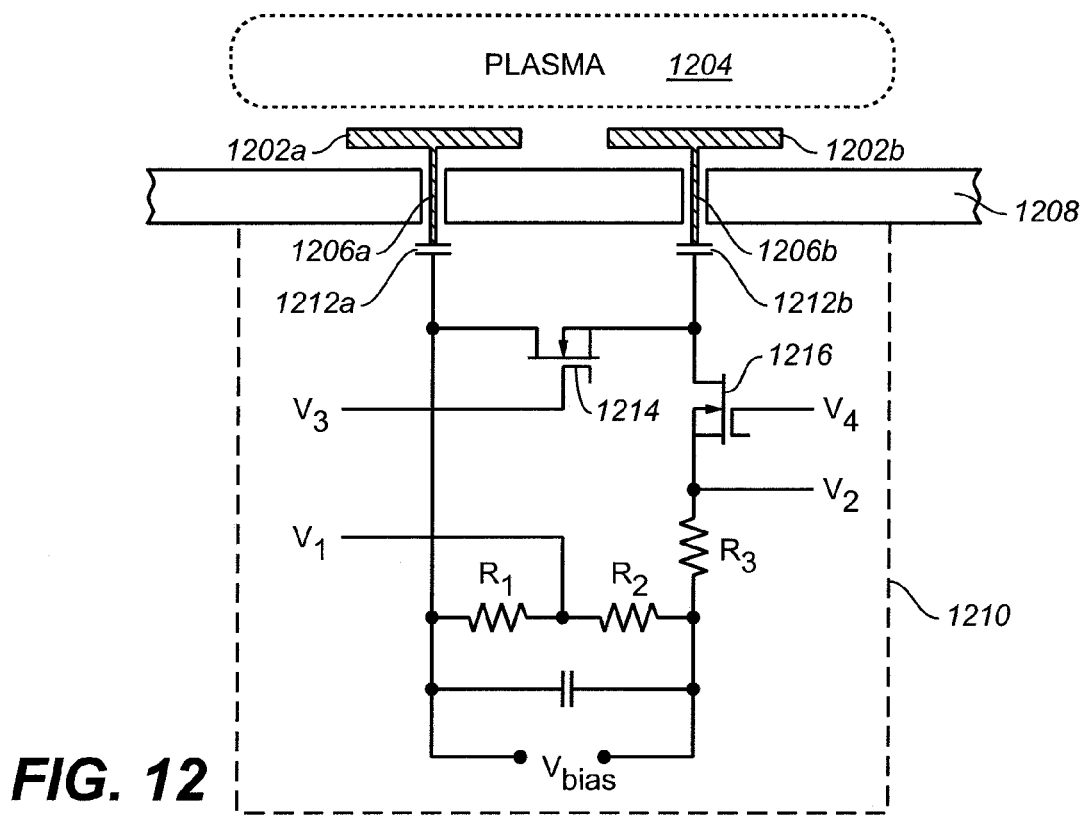
FIG. 12 shows a circuit that may be used with conductive pads to measure process conditions in a plasma environment.

FIG. 12 shows an exemplary double Langmuir probe circuit that may be used to obtain I-V data from pads 1202*a-b* in a plasma environment. In particular, FIG. 12 shows pads 1202*a-b* that are exposed to a plasma 1204, conductive leads 1206*a-b* passing through a first conductive portion 1208 to electronic components that are within a shielded volume 1210. Two capacitors 1212*a-b* are provided for isolation. These may be formed integrally with the pads 1202*a-b* in some cases, as described above. The circuit of FIG. 12 measures an applied bias voltage Vbias by sampling voltage V1 from a voltage divider formed by R1 and R2. Current is obtained from a measured voltage V2 across a known resistor R3. Two Field Effect Transistors (FETs) 1214, 1216 control the voltage provided to the pads 1202*a-b*. A voltage V3 to first FET 1214 connects the pads to discharge any voltage and reset the circuit. A voltage V4 applied to second FET 1216 applies the bias voltage Vbias between the pads 1202*a-b*. Thus, the circuit allows pulses of Vbias to be applied and I-V data to be gathered, with discharging occurring between pulses. Use of double Langmuir probes is described in U.S. Pat. No. 6,830,650, which patent also describes Topologically Dependent Charging (TDC) devices. TDC devices may be used instead of sensors in some embodiments. Also triple Langmuir probes or any other probe or sensor that places a conductive element in a noisy environment may be used in embodiments of the present invention.

Figure 13:
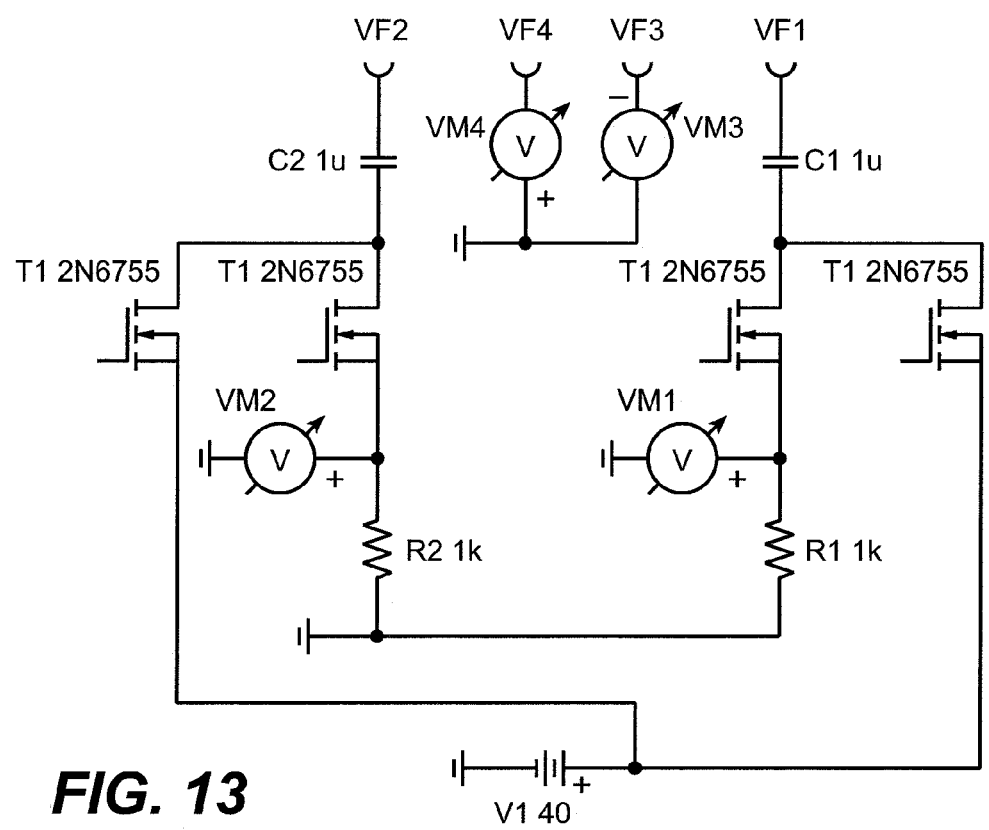
FIG. 13 shows a circuit diagram for a four point plasma probe using exposed antennae and shielded electronic components.

FIG. 13 shows a circuit diagram of a four point plasma probe that may use pads mounted to the exterior surface of a PCMD with electronic components shielded in one or more recesses within the PCMD. The probes may have different configurations. In one example, probes are circular and are arranged in a concentric arrangement. Thus, the center electrode is a disk and the other three electrodes are concentric rings. The outer ring has the same area as the disk. The intermediate electrodes may have different areas. As is shown by FIG. 13, a voltage is applied between the outer and inner electrodes so that saturation current may be measured (a square wave is used in one example). While this voltage is applied, the voltages on intermediate electrodes are measured to determine ion potential Vi. Using Vi, the plasma density may be determined.

While particular embodiments of the present invention and their advantages have been shown and described, it should be understood that various changes, substitutions and alterations can be made without departing from the scope of the invention as defined by the appended claims.

The invention claimed is:

1. A method of forming a process condition measuring device having protection against electromagnetic fields, comprising:

forming a first substrate portion of a conductive material;

forming a first contact pad on the first substrate portion, the first contact pad in direct electrical contact with the first substrate portion;

forming a second substrate portion of the conductive material;

forming a second contact pad on the second substrate portion, the second contact pad in direct electrical contact with the second substrate portion;

placing an electronic circuit between the first substrate portion and the second substrate portion; and subsequently, connecting the first substrate portion and the second substrate portion together, with the electronic circuit between them, such that the first contact pad is electrically connected to the second pad wherein the conductive material is doped Silicon.

2. The method of claim 1 wherein, prior to forming the first contact pad, Silicon dioxide is removed from the first conductive substrate and prior to forming the second contact pad, Silicon dioxide is removed from the second conductive substrate.

3. A method of forming a process condition measuring device having protection against electromagnetic fields, comprising:

forming a first substrate portion of a conductive material;

forming a first contact pad on the first substrate portion, the first contact pad in direct electrical contact with the first substrate portion;

forming a second substrate portion of the conductive material;

forming a second contact pad on the second substrate portion, the second contact pad in direct electrical contact with the second substrate portion;

placing an electronic circuit between the first substrate portion and the second substrate portion; and subsequently, connecting the first substrate portion and the second substrate portion together, with the electronic circuit between them, such that the first contact pad is electrically connected to the second pad wherein the first substrate portion and the second substrate portion connected together, with the electronic circuit between them form an assembly that has at least one dimension that is the same as a dimension of a standard Silicon wafer and wherein the assembly is a disk with a diameter of 150 millimeters, 200 millimeters or 300 millimeters.

4. A method of forming a process condition measuring device having protection against electromagnetic fields, comprising:

forming a first substrate portion of a conductive material;

forming a first contact pad on the first substrate portion, the first contact pad in direct electrical contact with the first substrate portion;

forming a second substrate portion of the conductive material;

forming a second contact pad on the second substrate portion, the second contact pad in direct electrical contact with the second substrate portion;

placing an electronic circuit between the first substrate portion and the second substrate portion; and subsequently, connecting the first substrate portion and the second substrate portion together, with the electronic circuit between them, such that the first contact pad is electrically connected to the second pad, wherein placing the electronic circuit between the first substrate portion and the second substrate portion includes sandwiching the electronic circuit between the first and second substrate portions such that the first contact pad faces the second contact pad.

5. The method of claim 4 wherein connecting the first substrate portion and the second substrate portion together includes bringing the first and second substrate portions together in a such a way that the first contact pad makes electrical contact with the second contact pad.

6. The method of claim 4 wherein connecting the first substrate portion and the second substrate portion together includes electrically connecting the first contact pad to the second contact pad with a conductive adhesive.

7. A method of forming a process condition measuring device having protection against electromagnetic fields, comprising:

forming a first substrate portion of a conductive material;

forming a first contact pad on the first substrate portion, the first contact pad in direct electrical contact with the first substrate portion;

forming a second substrate portion of the conductive material;

forming a second contact pad on the second substrate portion, the second contact pad in direct electrical contact with the second substrate portion;

placing an electronic circuit between the first substrate portion and the second substrate portion; and subsequently, connecting the first substrate portion and the second substrate portion together, with the electronic circuit between them, such that the first contact pad is electrically connected to the second pad, wherein connecting the first substrate portion and the second substrate portion together forms a conductive shield that protects the electronic circuit against electromagnetic fields.

8. The method of claim 7 wherein the conductive material is doped Silicon.

9. The method of claim 8 wherein, prior to forming the first contact pad, Silicon dioxide is removed from the first conductive substrate and prior to forming the second contact pad, Silicon dioxide is removed from the second conductive substrate.

* * * * *